United States Patent [19]

Frazier et al.

[11] Patent Number: 4,803,644
[45] Date of Patent: Feb. 7, 1989

[54] ALIGNMENT MARK DETECTOR FOR ELECTRON BEAM LITHOGRAPHY

[75] Inventors: James F. Frazier, Pacific Palisade; Oberdan W. Otto, Culver City; John Pasiecznik, Jr., Malibu, all of Calif.

[73] Assignee: Hughes Aircraft Company, Los Angeles, Calif.

[21] Appl. No.: 778,572

[22] Filed: Sep. 20, 1985

[51] Int. Cl.[4] ........................ G01B 15/00; G01N 23/00
[52] U.S. Cl. ............................... 364/559; 250/491.1; 364/819
[58] Field of Search ............... 364/490, 491, 559, 819, 364/822, 824; 358/110; 382/8, 48; 250/491.1, 492.2, 492.3

[56] References Cited

U.S. PATENT DOCUMENTS

| | | | |
|---|---|---|---|
| 3,898,617 | 8/1975 | Kashioka et al. | 382/8 |
| 3,901,814 | 8/1975 | Davis et al. | 250/491.1 |
| 3,924,113 | 12/1975 | Gill et al. | 364/559 |
| 4,056,730 | 11/1977 | Davis et al. | 250/492.1 |
| 4,109,029 | 8/1978 | Ozdemir et al. | 427/84 |
| 4,123,661 | 10/1978 | Wolf et al. | 250/492 A |
| 4,242,662 | 12/1980 | Tsujiyama et al. | 382/8 |
| 4,267,580 | 5/1981 | Bond et al. | 364/559 |
| 4,295,204 | 11/1981 | Sunstein | 364/824 |
| 4,297,676 | 11/1981 | Moriya et al. | 364/490 |
| 4,327,292 | 4/1982 | Wang et al. | 250/491.1 |
| 4,334,241 | 6/1982 | Kashioka et al. | 382/8 |
| 4,347,580 | 8/1982 | Bond | 364/824 |
| 4,370,554 | 1/1983 | Bohlen et al. | 250/491.1 |
| 4,385,238 | 5/1983 | Westerberg et al. | 250/491.1 |
| 4,407,933 | 10/1983 | Fraser et al. | 430/296 |
| 4,412,301 | 10/1983 | Strubeck | 364/824 |
| 4,547,864 | 10/1985 | Kawabata | 364/824 |
| 4,558,225 | 12/1985 | Gotou et al. | 250/491.1 |
| 4,636,968 | 1/1987 | Gotou et al. | 250/491.1 |

OTHER PUBLICATIONS

Hahmann et al., ZBA10 Electron-Beam Exposure System Further Improved, Jena. Rev. (Germany), JR 2, 1980, pp. 65-66.
Ozdemir et al., Computer Controlled Scanning Electron Microscope System for High Resolution Microelectronic Pattern Fabrication, IEEE Transactions on Electron Devices, vol. ED-19, No. 5, May 1972, pp. 624-628.
Davis et al., Automatic Registration in an Electron-Beam Lithographic System, Solid State Technology, Aug. 1978, pp. 61-67.
E. Argyle, "Techniques for Edge Detection", Proceedings of the IEEE, Feb. 1971, pp. 285-287.
D. Cumming, "A High Speed, Noise Tolerant Edge Detection Algorithm Using a Low Bandwidth Signal Chain for E-Beam Registration", (no publication data presently available).
D. Stephani, "Monte-Carlo Calculations of Backscattered Electrons at Registration Marks", J. Vac. Sci. Technol., 16(6), Nov./Dec. 1979, pp. 1739-1742.

Primary Examiner—Parshotam S. Lall
Attorney, Agent, or Firm—Wanda K. Denson-Low; V. G. Laslo; A. W. Karambelas

[57] ABSTRACT

A hardware system is disclosed for detecting alignment marks on a substrate in connection with electron beam lithography. The system is considerably faster than prior software approaches. A scanning signal derived from backscattered electrons as the beam scans the substrate is stored and updated in a set of shift registers as scanning proceeds. The signals in the scanning shift registers are compared with a predetermined reference signal, corresponding to the expected scanning signal when the beam traverses an edge of an alignment mark, stored in another set of shift registers. A correlation is obtained between the scanning and reference signals by multiplying the values of the corresponding cells in the scanning and reference registers, and accumulating and weighting the result. The locations of the maximum positive and negative correlations, and hence the locations of the opposed edges of the alignment mark, are obtained by means of a timing mechanism coordinated with the scanning.

15 Claims, 6 Drawing Sheets a.

b.

c.

d.

ALIGNMENT MARK DETECTOR FOR ELECTRON BEAM LITHOGRAPHY

BACKGROUND OF THE INVENTION

1. Field of the Invention

This invention relates to electron beam lithography, and more particularly for a system used to detect the location of alignment marks on a substrate so that proper alignment is maintained with an electron beam used to develop a circuit pattern on the substrate.

2. Description of Related Art

Electron beam lithography involves the scanning of a modulated electron beam over a semiconductor wafer to build up a series of circuit patterns on successive layers. Many layers of patterns are normally written; as each new layer is written it must be aligned very precisely with previously written layers. This is accomplished by positioning a martrix of alignment marks on the wafer, scanning the marks with the electron beam, and analyzing the resulting backscattered electron signal as it is affected by the topography of the mark or by the mark material to determine the exact mark locations. The marks are usually in the form of a cross or an "L", and a number of scans are made in each direction across its arms. The backscattered electrons are sensed, typically with a scintillation material and photodetector or an electron detecting diode, and the signals are processed to correlate the pattern of electrons received with a reference pattern. The detected mark locations are then used to compensate for positioning errors caused by the system's limited ability to consistently position the wafer in its holder mechanism, and by topological distortions introduced in the wafer during wafer processing.

A software system is presently available which locates alignment marks by correlating a scanning signal representing the backscattered electrons with a function which represents the opposed edges of an alignment mark. The resulting correlation has positive and negative peaks, one for each edge of the mark. From these peaks the approximate midpoint of the mark can be determined. The accuracy of this approach is improved as successive scans are performed for the same alignment mark to obtain successive sets of positive and negative peaks, one set for each scan.

While this software approach has been found to be highly accurate, it is relatively slow. This is an important limitation, because the time necessary to perform alignment is a significant limiting factor in the throughput of an electron beam lithography system. There is a need for another approach which retains the high accuracy of the software system, but improves its speed so that a greater throughput, and hence more efficient production rate of integrated circuits, can be achieved.

SUMMARY OF THE INVENTION

In view of the above problems associated with the prior art, it is an object of the present invention to provide a novel and improved system for detecting alignment marks in an electron beam lithography system, the system being highly accurate and yet much faster than what is currently available.

Another object is the provision of such an alignment mark detection system which can be implemented in a hardware system that achieves the desired higher speeds.

These and other objects are achieved in the present invention by means of a hardware implemented system in which a scanning signal corresponding to the back scattered electron signal is stored and updated to track the backscattered electron signal as scanning proceeds. A predetermined reference signal which corresponds to the electron beam traversing an edge of an alignment mark is also stored, and means are provided to compare the reference signal with the updated scanning signal. A correlation is thus obtained between the compared signals, during any particular scan, which corresponds to the scanning of an edge of an alignment mark. The reference signal may either have a direct correspondence to the expected scanning signal at an edge, or it may be a specially designed function that produces a more sharply defined correlation peak. Means are further provided to locate each such correlation as an indication of the location of the alignment mark.

In a preferred embodiment the system is used to detect the location of alignment marks which have substantially symmetrical opposed edges. The scan locations corresponding to the maximum positive and negative correlations during each scan are determined, thereby providing the locations of the opposite edges of the mark. The locating means preferably averages the locations of the maximum positive and negative correlations during successive scans to obtain the approximate midpoint of the mark.

The reference and scanning signals are each preferably presented in multiple weighted bit formats. Separate reference and scanning shift registers are provided for each bit of the corresponding signals, which are digitized for loading into the registers. The scanning signal samples are advanced through the scanning shift registers as each successive scanning sample is applied, with predetermined cells of the reference registers being multiplied by corresponding cells in the scanning registers for each scanning signal advancement. The multiplied results are weighted in bit order and accumulated to provide a correlation between the reference and scanning signals at each successive scanning location. Additional registers are provided to store the maximum positive and negative correlations during each scan, and the scan locations at which such maximum values occur. This stored information is then used to determine the alignment mark location.

The determination of the location of maximum correlations is delayed by a period sufficient to enable the accumulating means to complete its operation. In addition, the operation of the locating means is preferably initialized at the beginning of each new scan when the new scanning signal has advanced through the scanning registers at least as far as the stored reference signal. This prevents a backscattered electron level shift at the beginning of a new scan from being erroneously detected as the edge of an alignment mark. Alternately, each of the scanning register cells can be reset to the scanning signal level at the beginning of each new scan to prevent erroneous edge detections.

Further features and advantages of the invention will be apparent to those skilled in the art from the following detailed description of a preferred embodiment, taken together with the accompanying drawings, in which:

BRIEF DESCRIPTION OF THE DRAWINGS

FIG. 3a is a sectional view of an alignment mark being traversed by a scanning electron beam;

FIG. 3b is a trace of the backscattered electron signal derived from scanning the alignment mark of FIG. 3a;

FIG. 3c is a trace of a digitized reference signal corresponding to the backscattered electron signal obtained at the edges of the alignment mark shown in FIG. 3a;

FIG. 3d is a trace of a correlation signal obtained by comparing the signals of FIGS. 3b and 3c;

DESCRIPTION OF THE PREFERRED EMBODIMENT

Figure 1A:
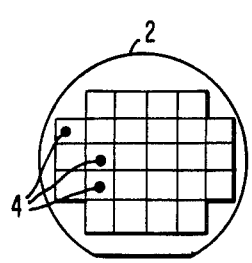
FIG. 1a is a plan view of a semiconductor wafer showing the positioning of chips thereon.

FIG. 1a shows a wafer 2 upon which multiple circuits are to be fabricated at various chip sites 4 by directing-writing electron beam lithography. As an example, wafer 2 may be a standard 3-inch diameter silicon member with a layer of silicon dioxide formed on the top surface.

Figure 1B:
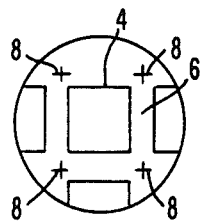
FIG. 1b is an enlarged view of a portion of the wafer shown in FIG. 1a, illustrating a typical placement of alignment marks on the wafer.

An enlarged view of one of the chip sites is illustrated in FIG. 1b. The chips are separated from each other by scribe corridors 6. If the wafer is to be written by machine capable of producing a very high speed integrated circuit (VHSIC), it would typically include one large alignment mark referred to as a navigational aid, and one or more smaller marks 8 at each intersection of the scribe corridors. In some situations a different set of fresh marks is used to align each processing level in the integrated circuit fabrication sequence to reduce the likelihood of introducing alignment errors as a result of physically degraded marks. In other cases the same marks are used for successive pattern layers, with scanning taking place either further away from the mark's center for each successive layer, or over the same portion of the mark if mark degradation is not a problem.

Figure 2:
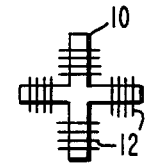
FIG. 2 is a plan view of a typical alignment mark that can be detected with the present system.

Referring now to FIG. 2, a typical alignment mark 10 in the shape of a cross is shown. Other shapes such as L's are also in common use. The scanning paths of an electron beam employed to locate the alignment mark are indicated by lines 12. Each arm of the alignment mark is traversed by repeated scans as the beam is incremented across each alignment mark area.

The invention makes use of an edge detection mechanism which determines the locations of the opposite edges of the mark during each scan. This information is accumulated for successive scans until an entire arm of the mark has been scanned, whereby the detected edge locations for each scan can be averaged to closely determine the approximate midpoint of the arm. Once the various alignment marks have been located in this manner to establish the precise position of the wafer, the electron beam can be precisely aligned with the wafer for the next production step.

Figure 3:
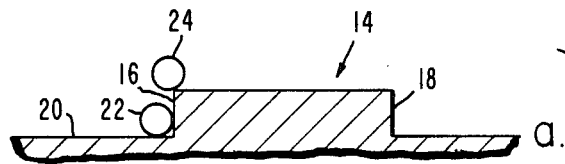
Figure 3:
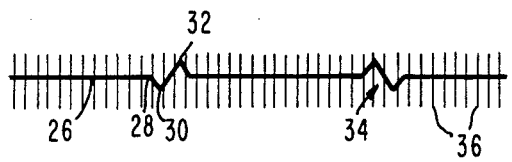
Figure 3:
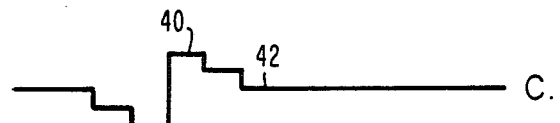
Figure 3:
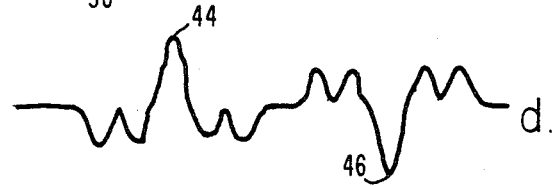

A sectional view indicating the scanning of a typical alignment mark is illustrated in FIG. 3a. A raised alignment mark 14 is shown in the form of a mesa mark, with generally symmetrical opposed edges 16 and 18 Mark 14 is elevated above the level of the wafer substrate 20. Circle 22 represents the cross-section of a scanning electron beam when it first meets the left-hand edge 16 of the alignment mark as it scans the wafer from left to right, while circle 24 represents the cross-section of the beam when it is centered over edge 16. FIG. 3b represents the backscattered electron signal from the wafer that can be detected by a conventional mechanism as the electron beam scans the alignment mark. For the mesa-type mark shown in FIG. 3a, the backscattered electron signal initially maintains a steady level 26 as the beam scans the flat wafer, and then begins to diminish at point 28 when the forward edge of the beam first comes into proximity with the left edge of the alignment mark, represented by circle 22 in FIG. 3a. The reduction in backscattered signal generally results from the interference of edge 16 with backscattered electrons, and continues to a point 30, beyond which the signal increases until a maximum value at point 32 is reached. The midpoint of this rising signal level corresponds generally to scanning beam position 24 in FIG. 3a. After reaching peak 32, the backscattered electron signal diminishes back to approximately its original level 26 as the beam continues to scan over the flat upper surface of the alignment mark. When the beam traverses the right-hand edge 18, which is generally symmetrical to edge 16, a backscattered signal 34 is produced which is similar to the signal at the left-hand edge, but inverted in polarity.

Each edge of the alignment is thus characterized by a distinctive backscattered electron pattern. Samples of the backscattered scanning signal, indicated by sample lines 36, are obtained and compared with a reference signal that stores an approximation of the characteristic edge signal. The scan location at which the backscattered signal samples match up with the reference signal is taken as an indication of an edge of the alignment mark. In some cases a preliminary coarse scan with a relatively low sampling rate is performed to find the approximate location of a mark. Fine scans are then performed with a sampling rate considerably greater than that indicated by sample lines 36 in the figure to locate the edges with a higher degree of precision. A positive peak correlation between the samples and the reference signal indicates the location of the leading edge of the mark, while a negative peak correlation indicates that a trailing edge has been scanned.

A digitized reference signal that is suitable for comparison with the backscattered electron scanning signal is illustrated in FIG. 3c. As noted in the figure, the reference signal first decreases in two steps to a minimum level 38, jumps to a maximum level 40, and then decreases again in two steps to its original level 42. (The horizontal scale in FIG. 3c has been expanded with respect to FIG. 3b for clarity; the duration of each step corresponds to the duration of one or more of the sampling cycles in FIG. 3b for the backscattered electron signal.) Different steps within the same reference signal may have different numbers of samples, depending upon the spatial frequency at which the mark is sampled, the size and profile of the mark and the signal it generates, and the particular reference signal used.

In accordance with the invention, the scanning signal samples are stored and continually updated as scanning proceeds, and the updated scanning signal is compared with the reference signal to obtain the correlation between the two. Maximum absolute correlations between the two signals indicate the location on an alignment mark, with a maximum positive correlation corresponding to one edge and a maximum negative correlation corresponding to the opposite edge. FIG. 3d illustrates such a correlation function resulting from a comparison of the scanning signal of FIG. 3b with the reference signal of FIG. 3c. A positive correlation peak 44 results when the signal corresponding to the left-hand alignment mark edge 16 is scanned, while negative peak 46 results from scanning the right-hand edge 18.

Figure 4:
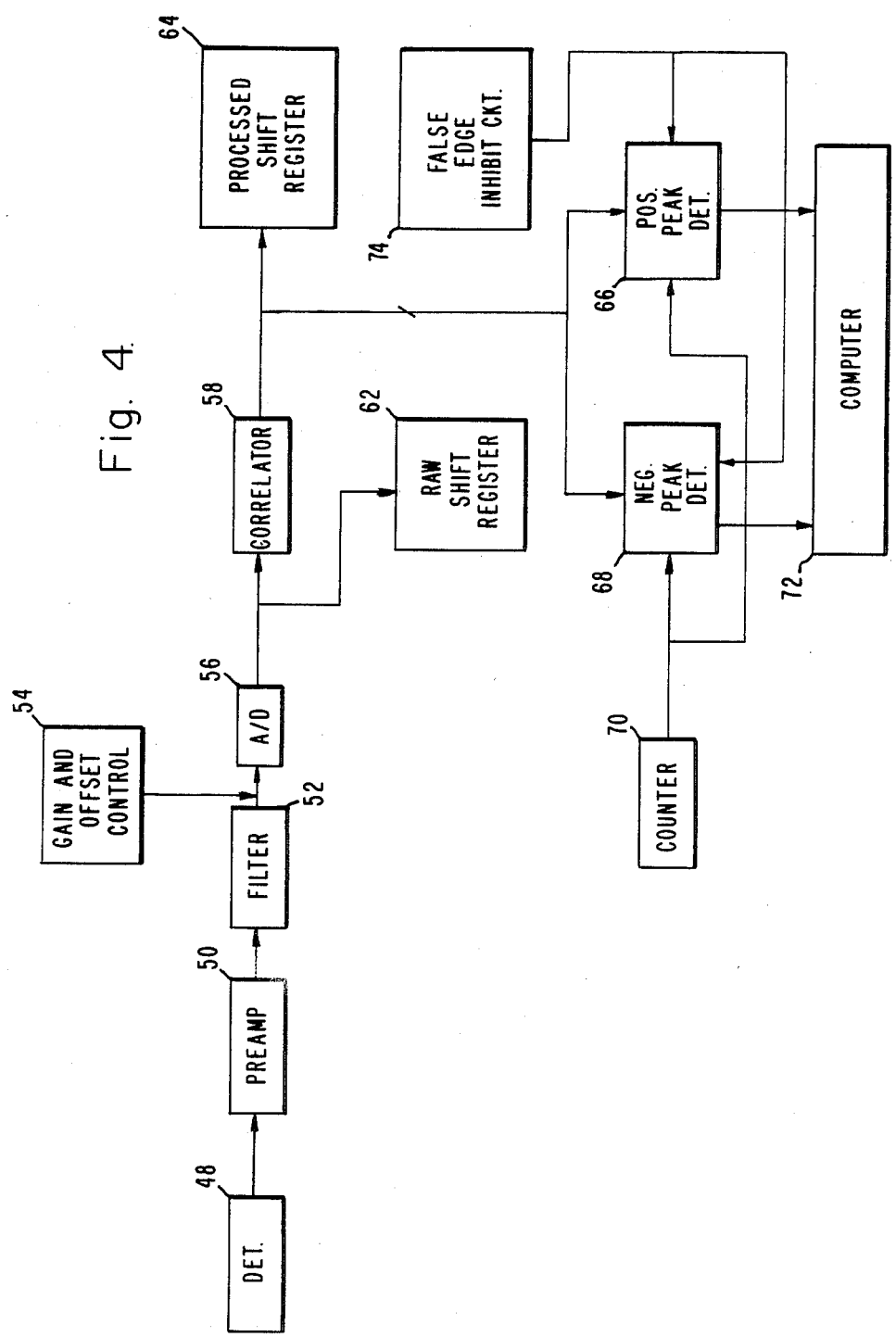
FIG. 4 is a block diagram of the present alignment mark detection system.

A block diagram of a fast acting hardware system for implementing the present invention is shown in FIG. 4. A backscattered electron detector 48, preferably in the form of a diode positioned above the wafer in a machine with VHSIC capability, delivers a signal corresponding to the backscattered electron level to a pre-amplifier 50. The amplified output is then delivered to a conventional filter 52 used to eliminate "aliasing", which is a distortion due to sampling the scanned signal at less than half the highest frequency component of the signal. Filter 52 eliminates excessively high signal frequencies from the amplified scanning signal. A gain and offset control circuit 54 places the filtered signal in the proper voltage range for a conversion from analog to digital format, which conversion is accomplished by analog-to-digital converter 56. In one embodiment the scanning signal is sampled to eight bits of resolution, requiring the use of at least an eight-bit converter 56. With a fairly simple reference function, such as that illustrated in FIG. 3c, the reference signal can be specified by a smaller number of bits without losing significant amounts of information.

A correlator 58 compares and obtains a correlation between the digitized scanning signal from converter 56 and an edge detection reference signal which has been pre-loaded into the correlator. The digitized scanning signal is also delivered to a raw shift register 62, which saves the raw scanning signal data prior to its being correlated with the reference signal for diagnostic purposes. The output of the correlator is similarly delivered to a processed shift register 64, which saves the correlation values in case of diagnostic need.

Positive and negative peak detectors 66 and 68 respectively store the maximum positive and negative correlation values during each scan. The location of the scanning beam at the occurrence of a correlation peak is determined by counter 70, which initiates a count in synchronism with the beginning of each scan. The resulting peak locations are fed into a computer 72, which tracks the positive and negative peak correlation locations during successive scans to determine the precise location of each alignment mark. A false edge inhibit circuit 74 prevents the peak detectors from erroneously sensing new scanning signal levels, resulting from a shift in the scanning location, as alignment mark edges.

Figure 5:
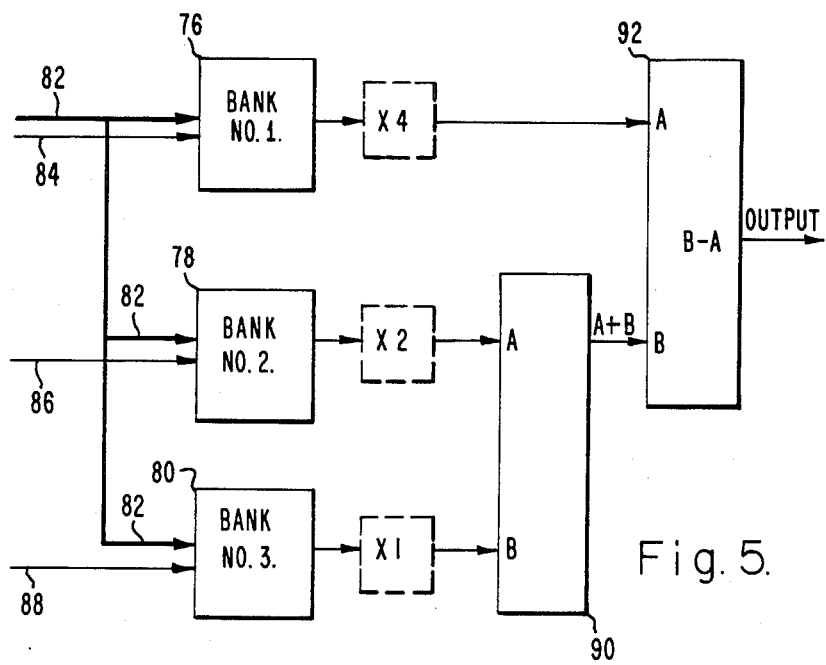
FIG. 5 is a block diagram of the section which correlates the scanning signal with the reference signal.

A block diagram of a preferred form for the signal correlator is given in FIG. 5. The system shown has three correlator banks 76, 78 and 80, and is intended for use with a reference edge detection signal having three-bit resolution; an extra correlator bank would be added for each additional bit of resolution. The digitized scanning signal is delivered over line 82 to each of the banks, the wide signal line indicating that the scanning signal has a multi-bit digitized format. The most significant bit of the reference edge detection signal is provided over line 84 to the first correlator bank 76, while the second most significant and least significant bits of the reference edge detection signal are provided respectively over lines 86 and 88 to correlator banks 78 and 80. Each of the correlator banks multiplies its input scanning signal by its input reference signal to obtain a correlation between the two signals. The outputs of the correlator banks are then weighted in accordance with the significance of their respective reference signal bits. Specifically, the output of bank 76 is multiplied by four, the output of bank 78 is multiplied by two, and the output of bank 80 is multiplied by unity. This multiplication actually takes place by shifting the positions of the signals in their respective registers. The multiplied outputs of banks 78 and 80 are then added together by adder 90, the output of which is then accumulated with the multiplied output of correlator bank 76 in accumulator 92. Since a "twos complement representation" signal format is preferably used to provide an indication of signal polarity as well as absolute value, and the most significant bit in this format represents a negative number, the multiplied output of correlator bank 76 is actually subtracted from the sum of the outputs of banks 78 and 80 in accumulator 92.

Figure 6:
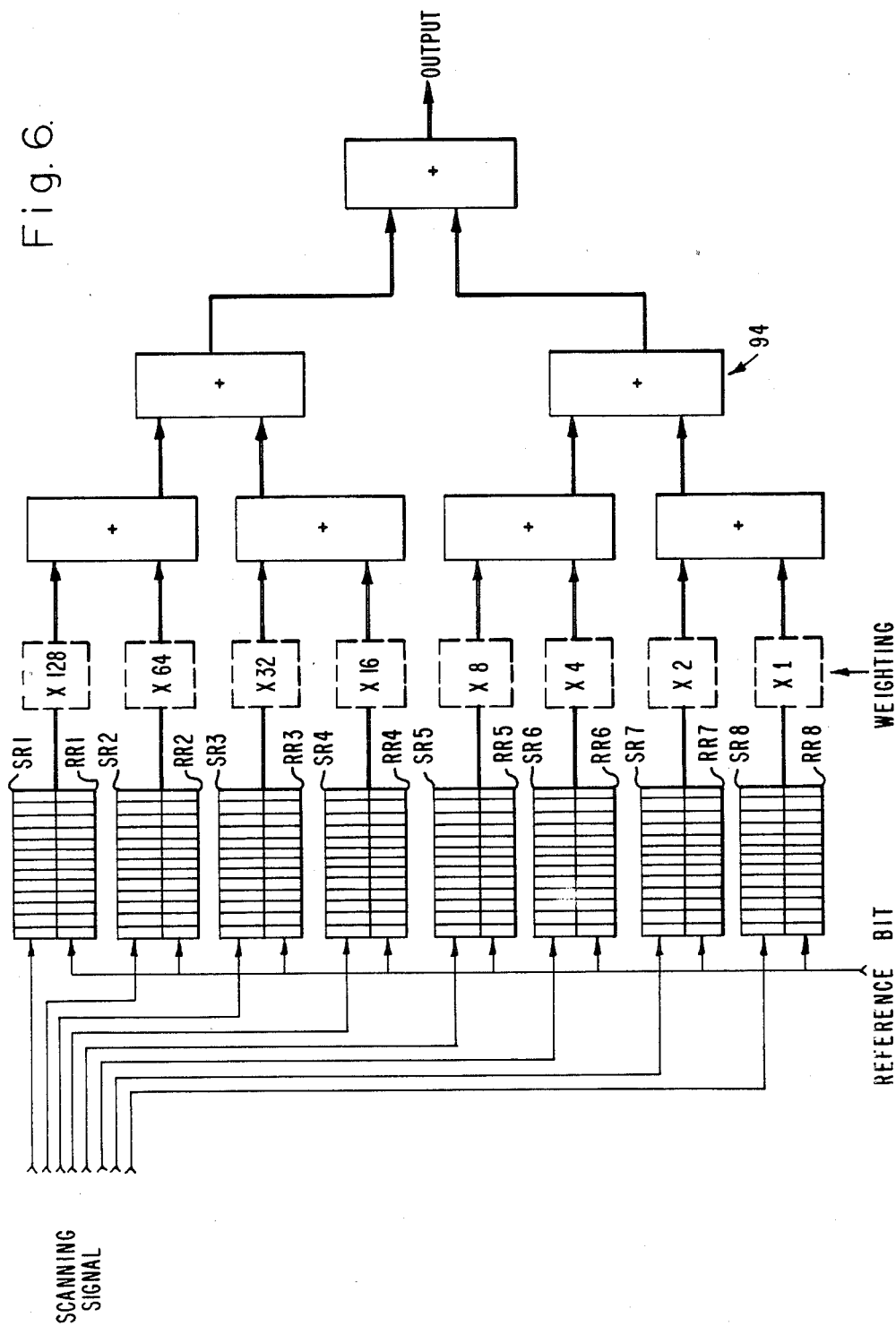
FIG. 6 is a block diagram of one bank within the correlator section.

The identical structure of each of the correlator banks 76, 78 and 80 is shown in FIG. 6. In this embodiment it is assumed that the digitized scanning signal is expressed to eight binary bits of resolution. Separate shift registers SR1-SR8 are provided to receive and store the various scanning signal bits, with SR1 receiving the most significant bit and SR8 the least significant bit. Associated with each of the scanning registers SR1-SR8 are reference shift registers RR1-RR8, respectively. Whereas all of the scanning signal bits are collectively applied to the scanning registers of each correlator bank, the three reference signal bits are divided among the three correlator banks, with each bank receiving one of the three depending upon the weighting of that bank. In FIG. 6, a common reference signal bit is applied to each of the reference registers RR1-RR8.

Each register pair consisting of one scanning register and one reference register can be implemented on a single chip, such as the TRW TDC 1023J. These chips consist essentially of two 64-bit shift registers. The successively sampled values of the various scanning signal bits are fed into scanning registers SR1-SR8 and advanced through the registers as scanning proceeds, so that the signals stored in the scanning registers are continually updated to reflect the current scanning status. A particular bit of the reference signal is loaded into the reference registers RR1-RR8 as part of the initialization of the system, and remains in the same position within the reference registers during the subsequent signal processing.

As each sample point of the scan is taken, the various bits of the scanning signal are clocked into their respective scanning registers. The correlation action consists of progressively advancing the scanning signal bits through their respective scanning registers for each successive scanning signal sample, multiplying the scanning samples in each scanning register by the reference signal held in the corresponding reference register for each scanning sample, and integrating the product.

Multiplication is accomplished by multiplying the scanning signal value in each cell of the scanning registers by the reference bit values in the corresponding cells of their respective reference registers.

The output of each correlator chip, consisting of one scanning register and one reference register, is weighted in accordance with the bit order of the various scanning signal bits. The weighting function is indicated in dashed lines, and as in the weighting of the outputs of the entire correlator banks may be accomplished by shifting the positions of the products of the multiplied signals within their respective registers. The weighted outputs of the each of the correlator chips are then added together by a series of adders generally indicated by reference numeral 94. The resulting output sum at any given time represents the value of the correlation between the scanning signal and a particular bit of the reference signal for a particular point in the scanning sequence. This output is then weighted in accordance with the significance of its reference bit, as indicated in connection with FIG. 5, and combined with the other weighted correlator bank outputs to obtain a net output signal which represents the correlation between the scanning and reference signals for that particular point of the scan.

Figure 7:
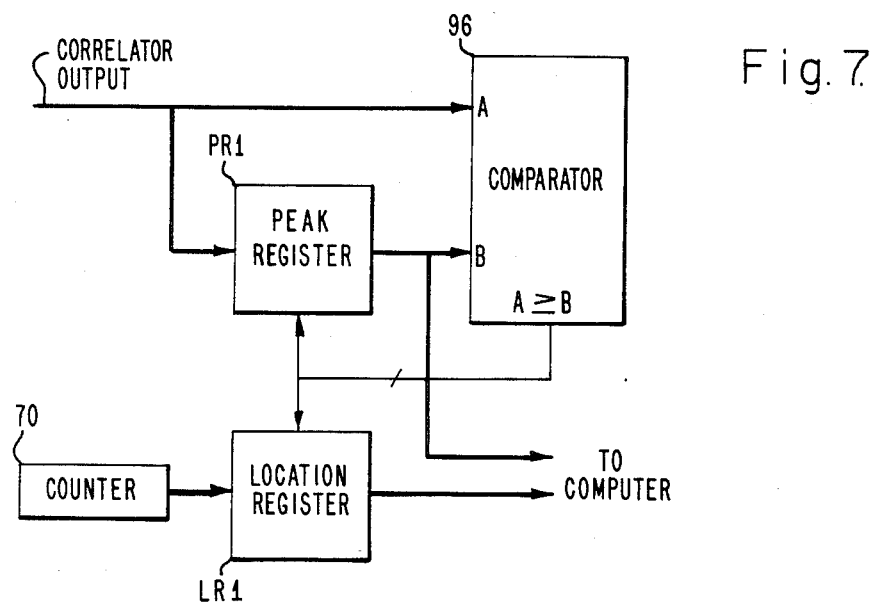
FIG. 7 is a block diagram of the section which detects maximum correlations between the scanning and reference signals and the locations at which they occur.

A circuit which can be used to identify the location at which the maximum correlation during each scan occurs is shown in FIG. 7. This circuit corresponds to the positive peak detector 66 of the FIG. 4 block diagram. The correlator output is applied to one input of a comparator 96, and also to a peak register PR1. The signal stored in the peak register is supplied to the other input of comparator 96, and is also made available to the computer. The peak register has a load line which is activated whenever the correlator input to the comparator exceeds or is equal to the peak register input to the comparator. (If the load line is activated only when the input from the correlator exceeds the input from the peak register, but not when the two inputs are equal, the detected peak locations might be offset.)

A location register LR1 is supplied with an input signal from counter 70 which corresponds to the location of the scanning electron beam at any particular time. The load line of the location register is connected to the output of comparator 96, and is activated in common with the load line for peak register PR1 whenever the correlator output exceeds or is equal to the current value held in the peak register. The output of the location register is also made available to computer 72.

Activating the load inputs to peak register PR1 and location register LR1 causes the peak register to be loaded with the new peak value, and the location register to be loaded with the count signal corresponding to the location of the peak value in the scan. Thus, the new maximum correlation value is stored in the peak register, and its location is stored in the location register. Since the maximum expected scanning signal during any particular scan corresponds to the electron beam traversing the edge of an alignment mark, the values stored in the peak register and location register at the end of each scan locate the edge of the alignment mark. The opposite edge of the alignment mark is preferably located by applying the correlator output to a circuit similar to that shown in FIG. 7 and inverting the comparator output to obtain the maximum negative correlation between the scanning and reference signals. The locations of the opposite alignment mark edges during successive scans are then used by the computer to calculate the precise position of the alignment mark.

Figure 8:
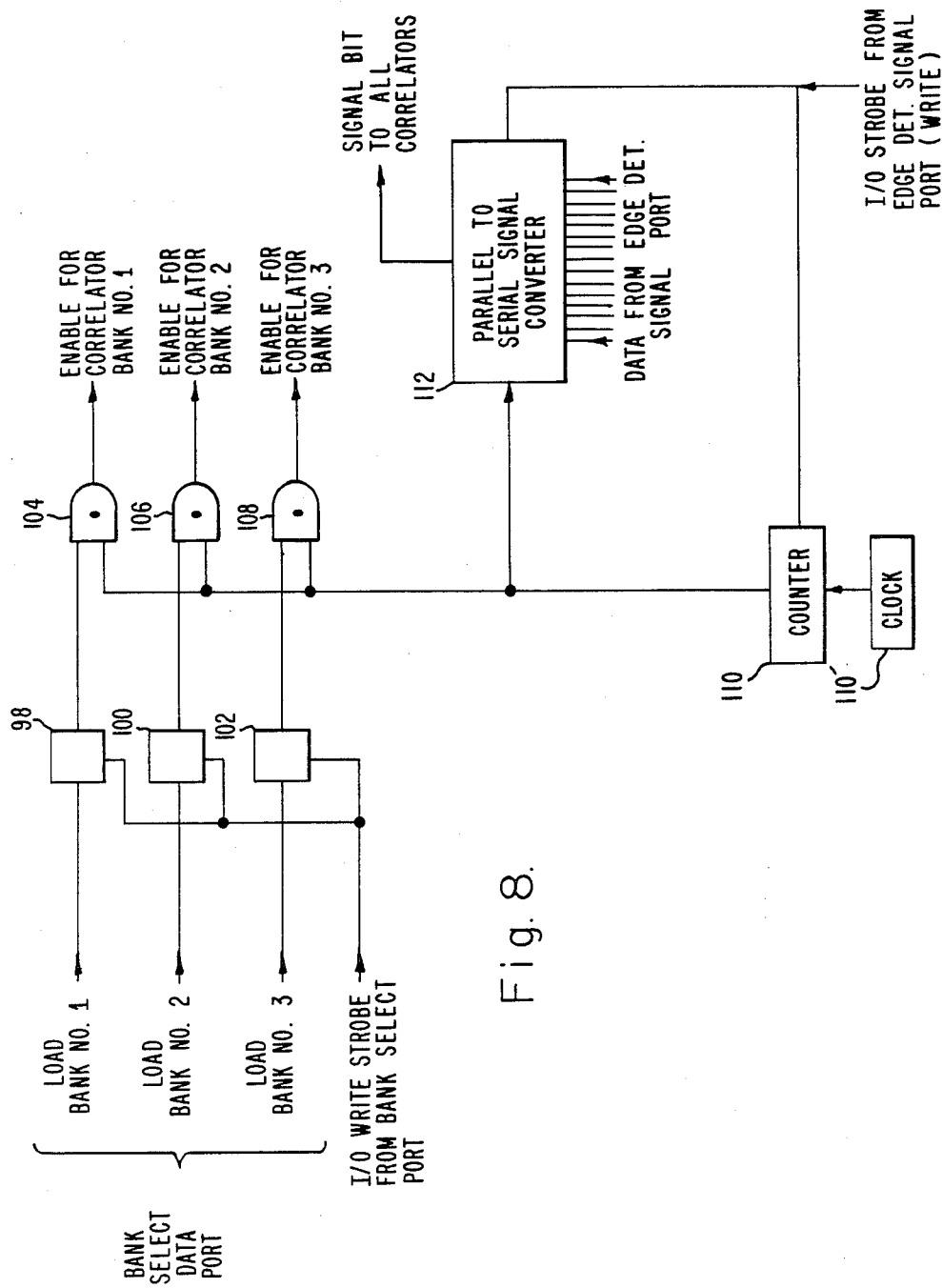
FIG. 8 is a schematic diagram of the interface circuitry used to load a reference signal into the correlator section.

Interface circuitry for supplying data from the computer to the correlator is shown in FIG. 8. It will be recalled that the reference edge detection signal has three bits of resolution in the described embodiment. Each reference bit is loaded into its corresponding correlator bank in sequence. Signals from a bank select data port on the computer I/O bus, corresponding to load enable signals for the three banks, are supplied respectively to flip-flops 98, 100 and 102. A synchronization signal from the computer's write strobe line is also applied to each of the flip-flops. When it is desired to load the appropriate reference signal bit for the first bank, an appropriate signal is delivered to set flip-flop 98 the output of which is processed through AND gate 104 to enable the reference loading for the first bank. Similar AND gates 106 and 108 are provided at the outputs of flip-flops 100 and 102, respectively. The other inputs to the three AND gates are supplied from a counter 110, driven by clock 110'. The basic function of the counter and the clock is to control a parallel to serial signal converter 112. The counter is initialized by the I/O strobe from the edge detection signal port.

The reference edge detection signal is in parallel format at the computer I/O bus, and must be converted to a serial format for loading into the reference registers RR1-RR8. An I/O strobe from the edge detection reference signal port controls the loading of the edge detection reference signal data into the converter. The serial output from the converter is applied in common to each of the correlator banks, with the enable signal from AND gates 104, 106 and 108 steering the reference signal bit data for loading in the reference registers of the appropriate correlator bank.

Figure 9:
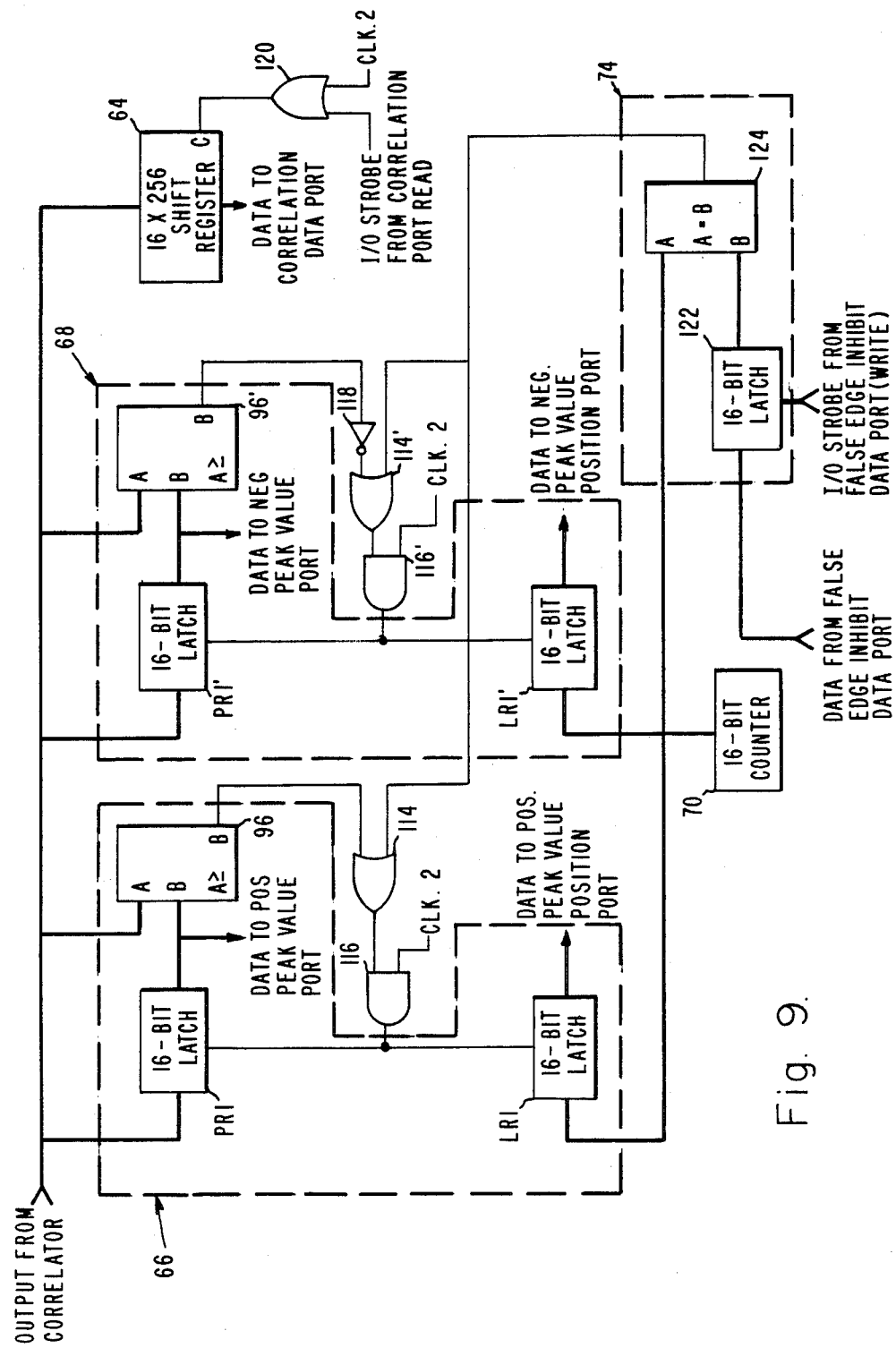
FIG. 9 is a block diagram of enable circuitry for the maximum signal correlation detector.

Since the various adders and subtractors in the correlator block require a finite time to accumulate all of the various correlation signals, it is desirable that the operation of the peak detectors be delayed by a sufficient period of time, relative to the essentially real time scanning signal delivered to the correlator, to keep the system in synchronism. To this end two separate clocks are used to control the system operation, one for the fuctions providing an input to the correlator and another for the functions which are based upon the correlator output. An implementation of this dual timing control is given in FIG. 9. Clock 1 is for the inputs to the correlator, while clock 2 is the delayed timing control governing the processing of the correlator output. In the exemplary embodiment a 16-bit data line is used, with positive and negative peak detectors 66 and 68 employing 16-bit latches for the peak and location registers. The output of comparator 96 in the positive peak detector circuit is processed through OR gate 114, under the control of the false edge inhibit circuit 74. The output is compared with the status of clock 2 in AND gate 116, and if both inputs are positive an output is produced which causes PR1 to load the current correlator output, and LR1 to load the current location count from counter 70. A similar circuit is provided for negative peak detector 68, except the output of comparator 96' of that circuit is processed through inverter 118 before being applied to OR gate 114'.

The shift register 64, which is implemented as a 16×256 register, is also governed by clock 2. A set of clock pulses is sent to the shift register from clock 2 through OR gate 120 to store the correlation values in the shift register while the scan is being made. A second set of clock pulses is sent to OR gate 120 and thereby to the shift register from the computer after a scan has been completed to enable the computer to read the values (one by one) stored in the shift register.

The false edge inhibit circuit 74 is implemented as a 16-bit latch 122, which loads a signal corresponding to the duration of the reference signal upon receiving an appropriate strobe signal. The output of latch 122 is provided to one input of a comparator 124, where it is compared with the beam locating signal from counter 70. When the counter signal is equal to the signal from latch 122, comparator 124 produces an output signal to initialize the positive and negative peak detectors. In effect, the false edge inhibit circuit 74 initializes the peak detectors when the counter is equal to the value of the first valid correlation signal, the scanning signal at the beginning of each new scan having advanced through the scanning registers by an amount at least equal to the portion of the reference registers occupied by the reference signal. This prevents the system from indicating the presence of a false edge. An alternate approach to solve the same problem would be to reset all of the cells in the scanning registers at the beginning of each new scan to the level of the first value read for such scan. The new scanning level would thus be a continuum of the indicated preceding scanning levels, and there would not be an appearance of a false edge when the new scanning signal is compared with the reference signal.

An improved hardware version of an alignment mark detector for electron beam lithography which operates at much higher speed than previous software has thus been shown and described. As numerous variations and alternate embodiments will occur to those skilled in the art, it is intened that the scope of the invention be limited only in terms of the appended claims.

What is claimed is:

1. In a system for detecting a single alignment mark which has a pair of opposed edges that are traversed by at least one scan of a scanning electron beam, in which the backscattered electrons from the mark are detected to provide an indication of the surface topology over which the beam is scanned, the improvement comprising:
    circuit means responsive to the detected backscattered electron signal from each scan for generating a scanning signal which corresponds to the backscattered electron signal for that scan, said circuit means providing successive digitized samples of the backscattered electron signal,
    means for storing a predetermined reference signal which comprises an expected backscattered electron signal corresponding to the electron beam traversing an edge of the single alignment mark, said reference signal storage means comprising at least one reference shift register for storing the reference signal in digitized format,
    means for comparing the reference signal with the scanning signal during each scan to obtain a correlation between the compared signals which indicates the level of coincidence therebetween,
    means for storing and updating the scanning signal to condition the scanning signal for comparison with the reference signal, said storage and updating means comprising at least one scanning shift register connected to receive said samples, and
    means for locating the position of the alignment mark edge during each scan in response to said level of coincidence reaching a peak level during that scan, the reference and scanning signals each comprising respective ordered sets of multi-bit words in which the bits of each word are ordered in a weighted bit format, separate reference and scanning registers are provided for each bit of their corresponding signals, and a signal multiplying means including means for shifting the ordered set for each signal in a serial fashion through their respective scanning and reference shift registers and multiplying together corresponding bits in the serial stream of information.

2. The system of claim 1, further comprising the locating means including means for averaging the locations of the maximum positive and negative levels of coincidence during successive parallel scans to obtain the approximate midpoint of an alignment mark.

3. The system of claim 1, wherein the locating means includes means for determining the location on the surface corresponding to a peak level of coincidence between the reference and scanning signals during a scan.

4. The system of claim 3, wherein the locating means includes means for determining the locations on the surface corresponding to peak positive and negative levels of coincidence between the reference and scanning signals during a scan, and thereby the locations of the mark's opposed edges.

5. The system of claim 3, said means for determining the surface location which corresponds to the peak level of coincidence comprising a scan location counter that locates the scanning signal with respect to the surface being scanned, a location storage means, means for applying a location signal from the scan location counter to the location storage means, a correlation storage means, means for applying a correlation signal from the comparing means to the correlation storage means, a comparator connected to compare the correlation signal with the signal stored in the correlation storage means, the comparator connected to cause the location storage means and correlation storage means to load in their respective applied location and correlation signals when the correlation signal exceeds a level determined by the signal stored in the correlation storage means, and means for resetting the location storage means and correlation storage means for each successive scan, whereby after each scan the correlation storage means stores the maximum signal correlation during that scan corresponding to said peak level of coincidence, and the location storage means stores the location at which the maximum correlation occurred.

6. The system of claim 1, wherein the scanning signal samples are advanced through said at least one scanning shift register as each successive sample is applied to said at least one scanning shift register, and the signal comparing means includes means for multiplying the signals in predetermined cells of the reference registers by the signals in corresponding cells in the scanning registers for each scanning signal advancement, and means for accumulating the multiplied results as an indication of the correlation between the reference and scanning signals.

7. The system of claim 6, wherein the accumulating means includes means for multiplying the multiplied results from each pair of reference and scanning shift registers by respective weighting coefficients which correspond to the weightings of their corresponding bits, and adding together the results.

8. The system of claim 6, further comprising means for delaying the operation of the locating means by a delay period sufficient to enable the accumulating means to complete its operation for a given scan signal.

9. The system of claim 6, further comprising means for initializing the locating means when the scanning signal for a new scan has advanced through the scanning registers at least as far as the stored reference signal, thereby preventing the erroneous detection of a backscattered electron level shift for a new scan as the edge of an alignment mark.

10. The system of claim 6, further comprising means for resetting each of the cells in the scanning registers to the scanning signal level at the beginning of each new scan, thereby preventing the erroneous detection of a backscattered level shift for a new scan as the edge of an alignment mark.

11. In a system for detecting a single alignment mark which has a pair of opposed edges that are traversed by a scanning electron beam in at least one scan, in which the backscattered electrons from the mark are detected to provide an indication of the surface topology over which the beam is scanned, the improvement comprising:

circuit means responsive to the detected backscattered electron signal during each scan for generating a multi-bit scanning signal which corresponds to the backscattered electron signal resulting from that scan, means for providing a predetermined multi-bit reference signal representative of an expected backscattered electron beam traversing an edge of the single alignment mark, a plurality of correlator banks corresponding in number to the number of reference signal bits, each bank including a plurality of paired multi-cell scanning and reference signal shift registers corresponding in number to the number of bits in the scanning signal, means for providing the bits of the multi-bit scanning signal to respective scanning shift registers within each correlator bank, means for providing the individual bits of the reference signal to each reference signal shift register within respective correlator banks, means for cross-multiplying the scanning signal held in each scanning shift register by the reference signal held in the corresponding reference shift register during each scan, accumulating and weighting the results in accordance with the significance of the scanning signal bit for each pair and the reference signal bit for each bank, to produce a weighted correlation output, means for detecting the locations of the positive and negative peak correlation values during each scan as an indication of the locations of the opposite edges of the alignment mark, and means for delaying the operation of the detecting means by a delay period sufficient to enable the cross-multiplying and weighting accumulating means to complete its accumulating operation for a given scan signal.

12. The alignment mark detection system of claim 11, wherein successive bit samples of the scanning signal are advanced through the scanning shift registers, and the cross-multiplying means includes means for multiplying the signals in predetermined cells of the reference registers by the signals in corresponding cells in the scanning registers for each scanning signal advancement through the scanning registers.

13. In a system for detecting a single alignment mark which has a pair of opposed edges that are traversed by a scanning electron beam in at least one scan, in which the backscattered electrons from the mark are detected to provide an indication of the surface topology over which the beam is scanned, the improvement comprising:

circuit means responsive to the detected backscattered electron signal during each scan for generating a multi-bit scanning signal which corresponds to the backscattered electron signal resulting from that scan, means for providing a predetermined multi-bit reference signal representative of an expected backscattered electron beam traversing an edge of the single alignment mark, a plurality of correlator banks corresponding in number to the number of reference signal bits, each bank including a plurality of paired multi-cell scanning and reference signal shift registers corresponding in number to the number of bits in the scanning signal, means for providing the bits of the multi-bit scanning signal to respective scanning shift registers within each correlator bank, means for providing the individual bits of the reference signal to each reference signal shift register within respective correlator banks, means for cross-multiplying the scanning signal held in each scanning shift register by the reference signal held in tee corresponding reference shift register during each scan, accumulating and weighting the results in accordance with the significance of the scanning signal bit for each pair and the reference signal bit for each bank, to produce a weighted correlation output, means for detecting the locations of the positive and negative peak correlation values during each scan as an indication of the locations of the opposite edges of the alignment mark, and means for initializing the locating means when the scanning signal for a new scan has advanced through the scanning registers at least as far as the stored reference signal, thereby preventing the erroneous detection of a backscattered electron level shift for a new scan as the edge of an alignment mark.

14. In a system for detecting a single alignment mark which has a pair of opposed edges that are traversed by a scanning electron beam in at least one scan, in which the backscattered electrons from the mark are detected to provide an indication of the surface topology over which the beam is scanned, the improvement comprising:

circuit means responsive to the detected backscattered electron signal during each scan for generating a multi-bit scanning signal which corresponds to the backscattered electron signal resulting from that scan, means for providing a predetermined multi-bit reference signal representative of an expected backscattered electron beam traversing an edge of the single alignment mark, a plurality of correlator banks corresponding in number to the number of reference signal bits, each bank including a plurality of paired multi-cell scanning and reference signal shift registers corresponding in number to the number of bits in the scanning signal, means for providing the bits of the multi-bit scanning signal to respective scanning shift registers within each correlator bank, means for providing the individual bits of the reference signal to each reference signal shift register within respective correlator banks, means for cross-multiplying the scanning signal held in each scanning shift register by the reference signal held in the corresponding reference shift register during each scan, accumulating and weighting the results in accordance with the significance of the scanning signal bit for each pair and the reference signal bit for each bank, to produce a weighted correlation output, means for detecting the locations of the positive and negative peak correlation values during each scan as an indication of the locations of the opposite edges of the alignment mark, and means for resetting each of the cells in the scanning registers to the scanning signal level at the beginning of each new scan, thereby preventing the erroneous detection of an alignment mark edge in response to a shift in the backscattered signal level associated with a new scan.

15. In a system for detecting a single alignment mark which has a pair of opposed edges that are traversed by a scanning electron beam in at least one scan, in which the backscattered electrons from the mark are detected to provide an indication of the surface topology over which the beam is scanned, the improvement comprising:

circuit means responsive to the detected backscattered electron signal during each scan for generating a multi-bit scanning signal which corresponds to the backscattered electron signal resulting from that scan, means for providing a predetermined multi-bit reference signal representive of an expected backscattered electron beam traversing an edge of the single alignment mark, a plurality of correlator banks corresponding in number to the number of reference signal bits, each bank including a plurality of paired multi-cell scanning and reference signal shift registers corresponding in number to the number of bits in the scanning signal, means for providing the bits of the multi-bit scanning signal to respective scanning shift registers within each correlator bank, means for providing the individual bits of the reference signal to each reference signal shift register within respective correlator banks, means for cross-multiplying the scanning signal held in each scanning shift register by the reference signal held in the corresponding reference shift register during each scan, accumulating and weighting the results in accordance with the significance of the scanning signal bit for each pair and the reference signal bit for each bank, to produce a weighted correlation output signal which is updated as scanning proceeds, and means for detecting the locations of the maximum and negative peak correlation values, said means for detecting comprising, for each peak, a scan location counter that locates the scanning signal with respect to the surface being scanned, a location storage means, means for applying a location signal from the scan location counter to the location storage means, a correlation storage means, means for applying a correlation signal from the comparing means to the correlation storage means, a comparator connected to compare the correlation signal with the signal sotred in the correlation storage means, the comparator connected to cause the location storage means and correlation storage means to load in their respective applied location and correlation signals when the correlation signal exceeds a level determined by the signal stored in the correlation storage means, and means for resetting the location storage means and correlation storage means for each successive scan, whereby after each scan the correlation storage means is storing the maximum signal correlation during the scan, and the location storage means is storing the location at which the maximum correlation occurred.

* * * * *